United States Patent [19]

Feuerstein

[11] Patent Number: 4,777,062

[45] Date of Patent: Oct. 11, 1988

[54] METHOD AND APPARATUS FOR REACTIVE VAPOR DEPOSITION OF METAL COMPOUNDS

[75] Inventor: Albert Feuerstein, Neuberg, Fed. Rep. of Germany

[73] Assignee: Leybold-Heraeus GmbH, Cologne, Fed. Rep. of Germany

[21] Appl. No.: 933,633

[22] Filed: Nov. 21, 1986

[30] Foreign Application Priority Data

Oct. 10, 1986 [DE]  Fed. Rep. of Germany ....... 3634598

[51] Int. Cl.$^4$ .............................................. C23C 16/00
[52] U.S. Cl. ...................................... 427/42; 427/38; 204/192.31
[58] Field of Search .......... 427/35; 118/50.1, 723–726

[56] References Cited

U.S. PATENT DOCUMENTS

| | | | |
|---|---|---|---|
| 3,371,649 | 3/1968 | Gowen | 118/723 |
| 3,777,704 | 11/1973 | Van Poucke | 118/726 |
| 3,974,059 | 8/1976 | Murayama | 118/726 |
| 4,217,855 | 8/1980 | Takagi | 118/726 |
| 4,286,545 | 9/1981 | Takagi et al. | 118/726 |
| 4,561,382 | 12/1985 | Zeren | 118/726 |
| 4,572,842 | 2/1986 | Dietrick et al. | 118/726 |

Primary Examiner—Thurman K. Page
Assistant Examiner—L. R. Horne
Attorney, Agent, or Firm—Felfe & Lynch

[57] ABSTRACT

A method and apparatus are disclosed for the reactive vapor deposition of metal compounds onto a substrate. At least one metal is evaporated from an elongated evaporation crucible in an atmosphere consisting of a reaction gas at a pressure of no more than $10^{-1}$ mbar. The metal is evaporated by means of an electron beam having an acceleration voltage of at least 20 kv. The invention solves the problem of providing stable an repeatable operating conditions, even with an evaporation crucible of considerable length.

5 Claims, 2 Drawing Sheets

METHOD AND APPARATUS FOR REACTIVE VAPOR DEPOSITION OF METAL COMPOUNDS

The invention relates to a method for the reactive vapor deposition of metal compounds onto substrates by the evaporation of at least one metal from an evaporating crucible by means of an electron beam in an atmosphere consisting of the reaction gas, at pressures of no more than $10^{-1}$ mbar, wherein (a) the metal vapor is produced in an inner chamber which surrounds the evaporator and which has a diaphragm aperture opposite the substrate, (b) the reaction gas is introduced into the inner chamber, (c) the metal vapor and reaction gas are directed through the diaphragm aperture toward the substrate, (d) the electron beam is made to interact in the inner chamber with the metal vapor and the reaction gas for ionization purposes, said beam having an acceleration voltage of at least 20 kV, and (e) the negative charge carriers formed in the inner chamber or enclosed therein are drawn through the diaphragm aperture by an electronic system lying beyond the diaphragm aperture and outside of the vapor stream, and biased positively with respect to ground, so that an intense glow discharge is produced which burns in the area of the diaphragm aperture and electrode.

The metals are preferably those which lead to the so-called "hard substances," such as for example titanium, zirconium, tantalum, vanadium and hafnium. The hard substances are compounds of at least one of these metals with nitrogen (nitrides), carbon (carbides) and with carbon and nitrogen simultaneously (so-called "carbonitrides"). The process, however, is also suitable for the reactive vapor deposition of other metals which are reacted, for example, with oxygen to form oxides.

A process of the kind described above is disclosed in the article by Bunshah and Raghuram, "Activated Reactive Evaporation Process for High Rate Deposition of Compounds," published in J. Vac. Sci. Technol., vol. 9, No. 6, November–December 1972, pages 1385 to 1388. In the process described therein, the metal is evaporated directly in the vacuum chamber by means of an electron beam of relatively low acceleration voltage (10 kV). Likewise, directly in the vapor stream there is a wire-like electrode which is positively biased with respect to ground, for example to a voltage between 80 and 200 V. In the operation of this apparatus the electron beam serves not only for the evaporation of the metal but also as an electron source, while the positive electrode attracts negative charge carriers, thus increasing the ionization probability, and is directly surrounded by a glow discharge. The known process and apparatus, however, have not advanced beyond application on a laboratory scale, since the rate of evaporation cannot be increased to the extent desired for large commercial processes. All attempts to increase the evaporation rate by increasing the beam current and thus the beam power have failed because the reaction was no longer stoichiometric, even though a nozzle for feeding the reaction gas discharges immediately above the evaporation zone. The deposition rates were between 4 and 9.7 micrometers per minute locally, but could not be distributed over a larger area, and the deposited layers contained a considerable amount of metal that did not participate in the reaction.

Therefore, in the coating of materials with layers of hard substances on a large commercial scale the process of magnetic field supported cathode sputtering has been used almost exclusively, but as yet the deposition rates of about 1 to 1.5 micrometers per minute have not been substantially exceeded.

In the state of the art is a method of the kind described above which has been disclosed by the German patent publication No. DE-OS 36 27 151. This method uses an electrode system is used which consists of a single electrode surrounding the diaphragm aperture in a substantially frame-like manner, so that all of the units of area of the electrode are always at the same potential. It has been found that such a process yields excellent results with relatively short crucible lengths, but that the discharge and the operation of the electron beam become increasingly unstable with increasing length of the evaporation crucible.

Rectangular evaporation crucibles of considerable length—say, lengths of about 50 cm and more—are required for the vapor coating of films of great width, when the direction of movement of the film is athwart the longest crucible axis, the longest crucible axis being the horizontal axis running across the mouth of the crucible. As a rule, the electron beam also moves along this longest axis in its periodic deflection on the material being evaporated.

In the process described above, it has been found in practice that the relatively strong electrical discharge is unstable, and especially that it wanders uncontrolledly lengthwise of the crucible. On this account, the course of the beam path at a particular moment does not always correspond to the course laid out by the deflection voltage of the deflection system or by the magnetic field of the deflection system. Strong discharges, amounting even to flashovers, force the electron beam to perform a lateral deviation, so that the result is unstable, and especially uncontrollable, evaporation conditions.

SUMMARY OF THE INVENTION

The present invention is therefore concerned with the problem of improving the first process described above such that, even in the case of evaporation crucibles of great considerable length, stable and repeatable operating conditions can be maintained.

The solution of the stated problem is accomplished, according to the invention, in the process described above, in that (f) the electron beam is moved periodically in the direction of the longest crucible axis above the metal that is to be evaporated, and (g) the electrode system on the other side of the diaphragm aperture consists of at least one row of single electrodes running parallel to the longest crucible axis, each of which is fed independently of the other single electrodes by a power source of its own.

In the application of the measures taken according to the invention, the correlation of the individual process parameters is positively maintained in each section of the length of the crucible, the sections of the length of the crucible being defined by the individual electrodes. Thus it is no longer possible for the local operation of the plasma discharge to be different from that of the electron beam, so that it cannot happen that the plasma discharge will be burning at one point on the evaporation crucible while the electron beam is at a different point on the evaporation crucible. Since the electron beam constitutes a quite essential energy source for the plasma discharge, a momentary separation of the plasma discharge and electron beam would result in a brief decrease of the intensity of the plasma discharge, to which the unstable operating conditions are to be attributed.

This problem is eliminated by the method according to the invention, which achieves extraordinarily stable operating conditions over the entire length of the crucible and assures a constant and uniform evaporation rate over the length of the crucible, including a stoichiometric reaction with the reaction gas. It is especially advantageous to allow the electron beam to dwell for a specific length of time in the area of each individual electrode. This local dwell, combined with an appropriately adapted deflection frequency, suffices to produce, at the points at which it occurs, so-called "hot spots" which serve as an additional element for stabilizing the plasma discharge at this point.

It is furthermore advantageous to introduce the reaction gas into the inner chamber through a plurality of manifolds which are distributed and arranged in a manner geometrically similar to that of the single electrodes.

The invention also relates to apparatus for practice of the method described above, having an outer vacuum chamber, an evaporating crucible and an electron gun for bombarding the material in the evaporation crucible with an electron beam, wherein (a) The space above the evaporation crucible is surrounded by an inner chamber which has an opening for the entry of the electron beam and a diaphragm aperture facing the substrate;

(b) The inner chamber is provided with a system for feeding a reaction gas; and (c) On the other side of the opening there is fastened, with insulation, an electrode system which does not lie in the area of projection of the diaphragm aperture, and which is connected to a power source having an output voltage that is positive with respect to ground.

For the solution of substantially the same problem, such an apparatus is characterized according to the invention by the following features:

(d) The electron gun, in a manner known in the case of an elongated evaporation crucible, has a deflection system whereby the electron beam can be moved periodically in the direction of the longest crucible axis over the metal that is to be evaporated;

(e) The electrode system on the other side of the diaphragm aperture consists of two rows of single electrodes running parallel to the longest crucible axis and arranged in pairs on either side of this axis; and (f) Each pair of single electrodes is connected with a power source which is independent from the power sources of the other pairs of single electrodes.

An embodiment of the subject matter of the invention will be further explained hereinafter with the aid of FIGS. 1 and 2 of the drawing.

DESCRIPTION OF THE PREFERRED EMBODIMENT

Figure 1:
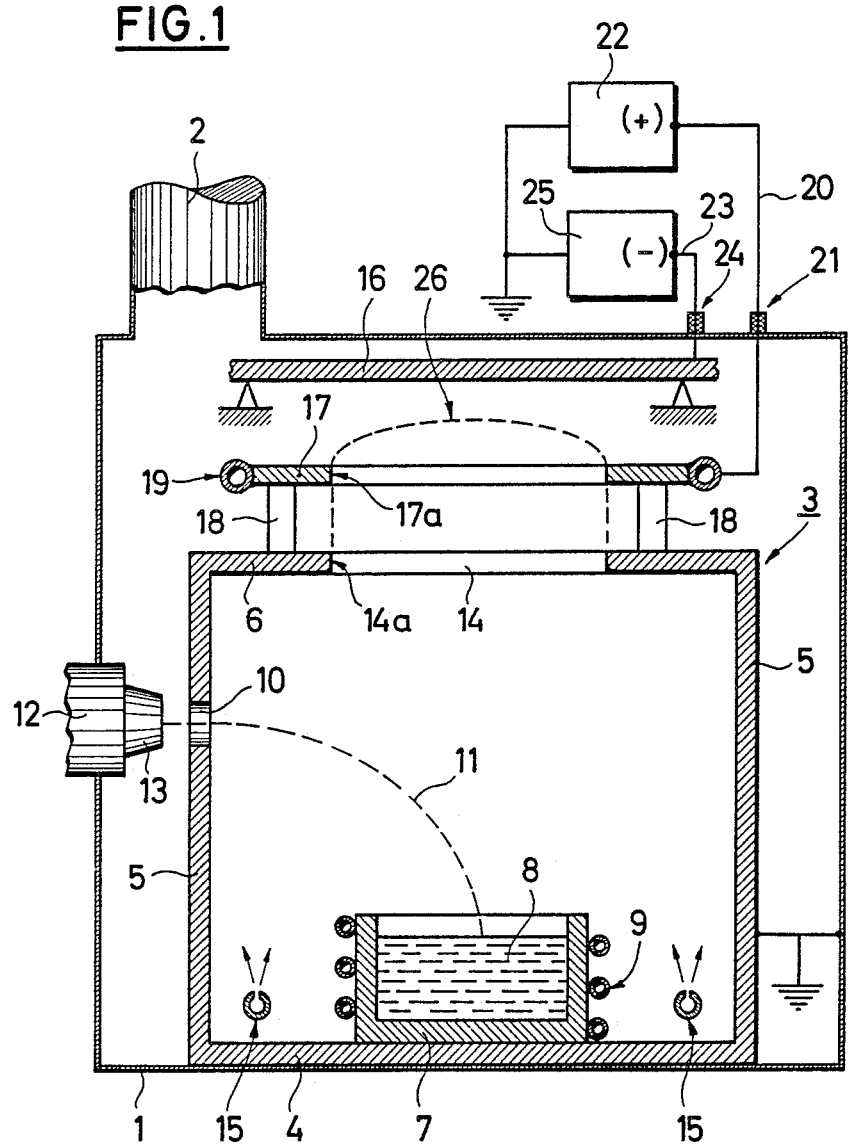
FIG. 1 is a diagrammatic representation of the apparatus according to the invention.

In FIG. 1 there is represented a vacuum chamber 1 evacuated through a suction connection 2 by a pump which is (not shown). In the outer vacuum chamber 1 there is an inner chamber 3 which has a horizontal floor 4, four vertical walls 5 and a horizontal roof 6. On the floor 4 rests an evaporating crucible 7 containing the molten material 8 which is being evaporated. The crucible 7 is surrounded by a cooling coil 9. In the left wall 5 there is an opening 10 for the admission of an electron beam 11 which is deflected on an arcuate path onto the surface of the material 8.

The means for deflecting the beam are state of the art. On the other side of the inlet opening 10 is an electron gun 12 with a deflection system 13 by which the electron beam 11 is periodically deflected in a given pattern controlled by a program.

The roof 6 of the inner chamber 3 is in the form of a diaphragm; i.e., it has an aperture 14 which has a markedly smaller cross section than the total cross section of the inner chamber 3. In the lower part of the inner chamber 3 there is a feeding system 15 that consists of perforated, straight tubes which are disposed perpendicular to the plane of the drawing and serve to feed the reaction gas. The vapor of the material 8, formed by the action of the electron beam 11, and the gas fed through the feed system 15, is guided through the diaphragm aperture 14 onto a substrate 16 which moves or is stationary above the diaphragm aperture 14. In the present case the substrate 16 is represented as being stationary.

On the other side of the diaphragm aperture 14, i.e., between the roof 6 and the substrate 16, there is an electrode system 17 which is not within the area of the projection of the diaphragm aperture 14 and which is supported by insulators 18 on the roof 6. The inside edges 14a of the diaphragm aperture 14 form a rectangle; the same is also the case with the inner edges 17a of the electrode system. The system is so disposed that the inside edges 14a and 17a are substantially in alignment with one another, although slight departures from alignment are not critical.

While the inner chamber 3 as well as the outer vacuum chamber 1 and the evaporating crucible 7 are at ground potential, the electrode system 17 is connected by a wire harness 20 passing through an insulating grommet 21 to a power source 22. While it is possible also to place the substrate 16 at ground potential, it can also be connected to a direct-current source 25 by a conductor 23 running through an insulating grommet 24. Due to the above-described potential difference between the electrode system 17 and the inner chamber 3, an extremely intense plasma discharge is produced in the area of the diaphragm aperture 14; the upper and lateral limits of this discharge can be indicated approximately by the broken line 26. Let it be assumed, for example, that the distance between the top surface of the roof 6 and the top of the electrode system 17 is equal to 31 mm, and the distance between the top of the electrode 17 and the bottom of the substrate 16 is 34 mm.

Figure 2:
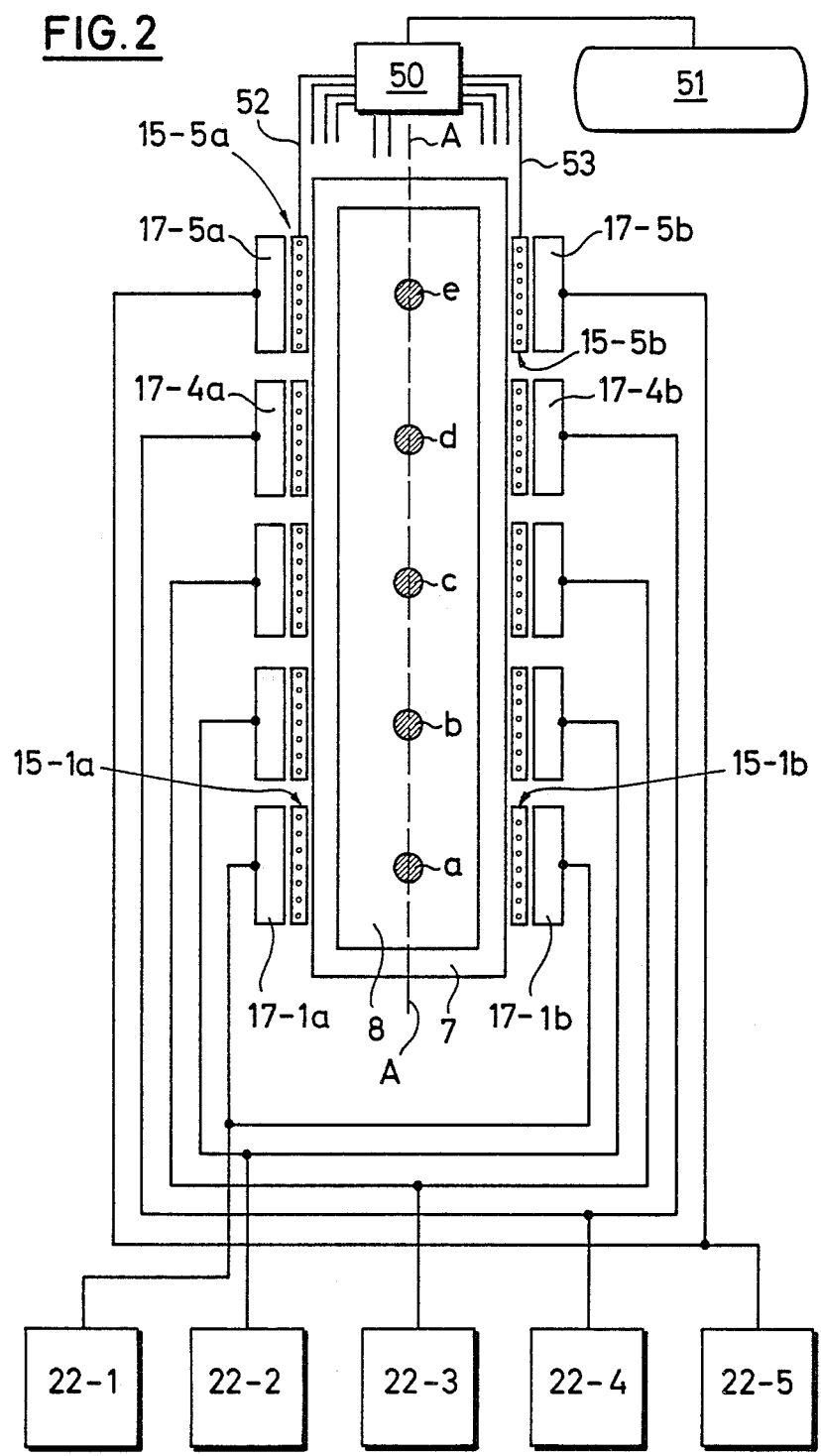
FIG. 2 is a top view of the apparatus of FIG. 1.

In FIG. 2, only the most important parts have been taken from FIG. 1. It can be seen first that the evaporating crucible 7 has the outline of an elongated rectangle and consequently it has a longest crucible axis A—A indicated by the broken center line. By means of the deflection system 13 the electron beam 11 is guided along this axis A—A according to a given pattern over the material 8 (metal) that is being evaporated, at a periodic rate, with a deflection frequency between 5 and 500 Hz, preferably between 100 and 200 Hz. The deflection is performed step-wise with certain periods of dwelling at several dwell points a, b, c, d and e, which are indicated by the hatched circles. While the distance between the dwell points is preferably equal, the dwell periods themselves do not have to be equally long. For example, it is regularly necessary to make the dwell times in the area of the crucible ends longer than the dwell times in the middle of the crucible, in order both to compensate for the greater heat losses in the crucible end areas and to make up for the fact that the vapor strikes the margins of the substrates passing over the crucible from substantially only one direction.

It can be seen that the electrode system consists of two parallel rows of single electrodes disposed in pairs, one on each side of the longest crucible axis A—A. The left row is numbered 17-1a to 17-5a, while the right row is numbered 17-1b to 17-5b. The single electrodes situated opposite one another with respect to the axis A—A form pairs, e.g., pair 17-1a/17-1b etc. It can furthermore be seen that each pair of single electrodes is connected by conductors (not shown) to one power source each, 22-1 to 22-5, which are adjustable individually and independently of one another to a particular current flow. For the sake of simplicity, let it be assumed that the dwell points indicated by hatching in FIG. 2 coincide, while the electron beam is striking the dwell point, with the momentary point of impingement. In that case the point of impingement a belongs to the pair of single electrodes 17-1a and 17-1b. This is the pair of single electrodes that is closest to the point of impingement a. The point of impingement b belongs to the pair of single electrodes 17-2a and 17-2b and so forth. This defined spatial association of individual points of impingement or dwell points with particular electrode pairs divides the system lengthwise of the crucible into single systems whose operating parameters are specifically controllable.

It is especially desirable to provide the same axial length and uniform spacing for all the single electrodes, as represented in FIG. 2. This is not essential, however, so that the lengths of the single electrodes and electrode pairs can be adapted to various distances between the individual dwell points.

It is furthermore indicated in FIG. 2 that the reaction gas feeding system consists of two rows of manifolds parallel to the longest crucible axis A—A, one on either side of the latter, and arranged in pairs. The left row of manifolds is numbered from 15-1a to 15-5a, while the right row of manifolds is numbered from 15-1b to 15-5b. The arrangement is geometrically similar to that of the single electrodes, i.e., the individual manifolds are associated with both one pair of electrodes and one particular dwell point. The manifolds 15-1a and 15-1b form one pair, and so on, up to the pair of manifolds 15-5a/15-5b.

The manifolds are connected in pairs through a control unit 50 to a gas source 51, enabling an individual adaptation by the control unit 50 to the gas demand which depends on the conditions of the reaction.

Nevertheless, only the two gas lines 52 and 53 running to the pair of manifolds 15-5a and 15-5b are shown in the drawing, while the gas lines to the rest of the distributor tubes are indicated only at their beginnings at the control unit 50.

It is to be seen, especially from FIG. 2, that the manifolds in the inner chamber 3 (FIG. 1), which is not indicated here, are distributed and arranged in a manner that is geometrically similar to the individual electrodes.

There has thus been shown and described a novel method and apparatus for reactive vapor deposition of metal compounds which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follow.

I claim:

1. In a method for the reactive vapor deposition of metal compounds onto a substrate by the evaporation of at least one metal from an elongated evaporation crucible by means of an electron beam in an atmosphere consisting of a reaction gas, at pressures of no more than $10^{-1}$ mbar, wherein
    (a) the metal vapor is produced in an inner chamber which surrounds the evaporator and which has a diaphragm aperture opposite the substrate,
    (b) the reaction gas is introduced into said inner chamber,
    (c) metal vapor and reaction gas are directed through the diaphragm aperture toward the substrate,
    (d) the electron beam is made to interact in said inner chamber with the metal vapor and the reaction gas for ionization purposes with an acceleration voltage of at least 20 kV, and
    (e) the negative charge carriers in said inner chamber are drawn through the diaphragm aperture by an electrode system arranged outside said diaphragm aperture and outside of the vapor stream and biased positively with respect to ground, so that an intense glow discharge is produced which burns in the area of said diaphragm aperture and electrode system, an electron gun including deflecting means, the improvement comprising the steps of:
    (1) periodically moving said electron beam in the direction of the longest crucible axis over the metal that is to be evaporated, and
    (2) providing, in said electrode system, at least one row of single electrodes running parallel to the longest crucible axis, each single electrode being supplied independently of the other single electrodes by a separate power source.

2. The method according to claim 1, wherein said electron beam is made to dwell for a specific period of time in the region of each single electrode.

3. The method according to claim 1, wherein said electrode system comprising of two rows of paired single electrodes arrayed on both sides of said crucible axis, and wherein each pair of electrodes is supplied by a power source which is independent of the power sources for the other pairs of single electrodes.

4. In apparatus for carrying out the method according to claim 1, said apparatus having an outer vacuum chamber, an elongated evaporation crucible, and an electron gun for bombarding the evaporation material situated in the evaporation crucible with an electron beam, and wherein
    (a) the space above said evaporation crucible is surrounded by an inner chamber which has an opening for entry of said electron beam and a diaphragm aperture facing the substrate,
    (b) said inner chamber is provided with a system for supplying a reaction gas, and
    (c) an electrically insulated electrode system arranged outside of said diaphragm aperture and outside the area of projection of said aperture, said electrode system being connected to a power source having an output voltage that is positive with respect to ground;
the improvement wherein:
(1) said electron gun includes deflection means for periodically moving said electron beam in the direction of the longest crucible axis above the metal that is to be evaporated,
(2) said electrode system outside of said diaphragm aperture comprises two rows of single electrodes extending parallel to the longest crucible axis and on both sides of said axis, in pairs, and
(3) each pair of single electrodes is connected to a power source which is independent of the power sources of the other pairs of single electrodes.

5. Apparatus according to claim 4, wherein said system for feeding the reaction gas comprises two rows of paired manifolds arranged in parallel with said longest crucible axis and on both sides of said axis.